United States Patent
Hara et al.

(10) Patent No.: US 6,903,983 B2
(45) Date of Patent: Jun. 7, 2005

(54) SEMICONDUCTOR INTEGRATED CIRCUIT DEVICE AND READ START TRIGGER SIGNAL GENERATING METHOD THEREFOR

(75) Inventors: Tokumasa Hara, Tachikawa (JP); Hidetoshi Saito, Yamato (JP); Hitoshi Shiga, Yokohama (JP); Yasuhiko Honda, Yokohama (JP); Tadayuki Taura, Zushi (JP); Hideo Kato, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/325,753

(22) Filed: Dec. 23, 2002

(65) Prior Publication Data

US 2004/0085819 A1 May 6, 2004

(30) Foreign Application Priority Data

Dec. 26, 2001 (JP) ........................................ 2001-395476

(51) Int. Cl.[7] ............................................. G11C 16/04
(52) U.S. Cl. ................................ 365/189.04; 365/233.5
(58) Field of Search ...................... 365/189.04, 189.08, 365/189.12, 194, 230.08, 233.5

(56) References Cited

U.S. PATENT DOCUMENTS

| | | | | |
|---|---|---|---|---|
| 6,111,787 | A | 8/2000 | Akaogi et al. | 365/185.11 |
| 6,320,800 | B1 | 11/2001 | Saito et al. | 365/200 |
| 6,324,115 | B1 * | 11/2001 | Choi | 365/230.03 |
| 2004/0001366 | A1 * | 1/2004 | Peronni et al. | 365/199 |

FOREIGN PATENT DOCUMENTS

JP          2001-52495          2/2001

* cited by examiner

Primary Examiner—Richard Elms
Assistant Examiner—Hien Nguyen
(74) Attorney, Agent, or Firm—Oblon, Spivak, McClelland, Maier & Neustadt, P.C.

(57) ABSTRACT

A semiconductor integrated circuit device includes a first memory cell array corresponding to bank 0, a second memory cell array corresponding to bank 1, first address transition signal generating circuits which detect transitions of input addresses and generate first address transition signals, a second address transition signal generating circuit which pre-detects an end of automatic execution of bank 0 or bank 1 and generates a second address transition signal, and a read start trigger output circuit. The read start trigger output circuit outputs a read start trigger signal on the basis of the first address transition signals and the second address transition signal.

16 Claims, 12 Drawing Sheets

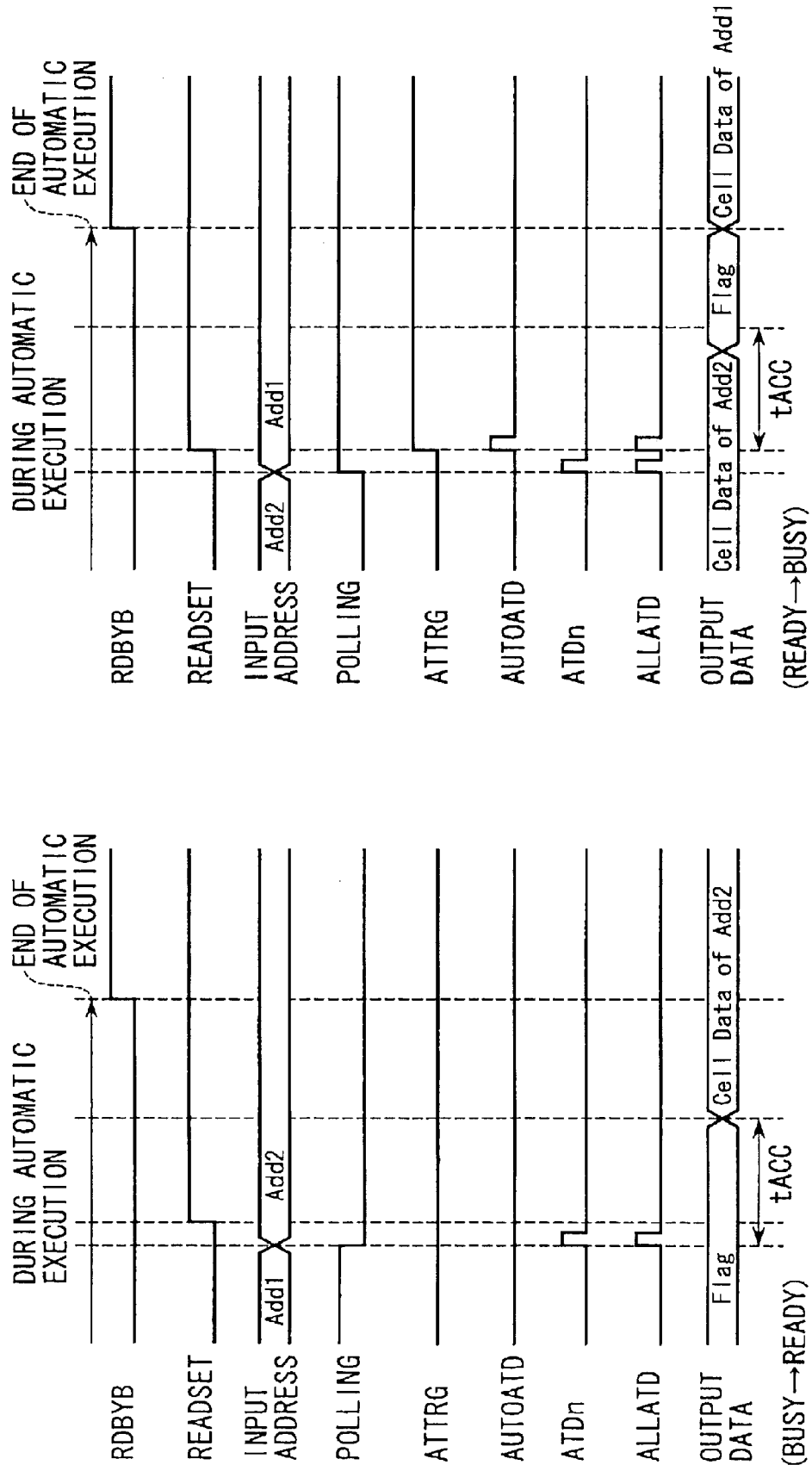

SEMICONDUCTOR INTEGRATED CIRCUIT DEVICE AND READ START TRIGGER SIGNAL GENERATING METHOD THEREFOR

CROSS-REFERENCE TO RELATED APPLICATIONS

This application is based upon and claims the benefit of priority from the prior Japanese Patent Application No. 2001-395476, filed Dec. 26, 2001, the entire contents of which are incorporated herein by reference.

BACKGROUND OF THE INVENTION

1. Field of the Invention

The present invention relates to a semiconductor integrated circuit device and, more particularly, to a semiconductor integrated circuit device which has a nonvolatile memory section having an automatic execution function for a data rewrite and a simultaneous execution function for a data read during automatic execution, and a read start trigger signal generating method for the device.

2. Description of the Related Art

An EEPROM capable of electrically rewriting data normally has an automatic execution function for a data rewrite. This automatic execution requires several μs to several ms, although a normal read is performed in several ten ns. For this reason, once automatic execution is started, a wait time is required until the next data read.

To improve this disadvantage, some EEPROMs have a simultaneous execution function. The entire memory cell region is partitioned into a plurality of banks. Even while a given bank is under automatic execution, the remaining banks can normally be read-accessed. With this simultaneous execution function, when an input read address matches the bank address under automatic execution, a hardware sequence flag is read out. If the addresses do not match, cell data is read out from a memory cell.

When a signal RDBYB changes from "0" to "1", the user is notified of the end of automatic operation of the EEPROM. If the address of the read-access destination matches the address of the bank that is being automatically executed, switching from the hardware sequence flag to the cell data is executed after the signal RDBYB has changed from "0" to "1".

In this way, if the address of the read-access destination matches the address of the bank that is being automatically executed, switching from the hardware sequence flag to the cell data is executed after the signal RDBYB has changed from "0" to "1".

BRIEF SUMMARY OF THE INVENTION

A semiconductor integrated circuit device according to a first aspect of the present invention comprises a semiconductor integrated circuit device which has a nonvolatile memory section having an automatic execution function for a data rewrite and a simultaneous execution function for a data read during automatic execution, comprising:

a first memory cell array which has nonvolatile memory cells arrayed and corresponds to one bank;

a second memory cell array which has nonvolatile memory cells arrayed and corresponds to the other bank different from the one bank;

a plurality of first address transition signal generating circuits which detect transitions of input addresses when the transitions of the input addresses have occurred and generate a plurality of first address transition signals;

a second address transition signal generating circuit which pre-detects an end of automatic execution of the one bank and generates a second address transition signal; and a read start trigger output circuit which outputs a read start trigger signal serving as a trigger for a start of a read on the basis of the first address transition signals and the second address transition signal.

A read start trigger signal generating method according to a second aspect of the present invention comprises a read start trigger signal generating method for a semiconductor integrated circuit device which has a nonvolatile memory section having an automatic execution function for a data rewrite and a simultaneous execution function for a data read during automatic execution, comprising:

upon re-detecting an end of automatic execution, determining whether the nonvolatile memory section is executing read operation based on input address transitions;

generating a read start trigger signal when the read operation is not being executed; and if the read operation is being executed, generating the read start trigger signal when the read operation is ended.

A read start trigger signal generating method according to a third aspect of the present invention comprises a read start trigger signal generating method for a semiconductor integrated circuit device which has a nonvolatile memory section having an automatic execution function for a data rewrite and a simultaneous execution function for a data read during automatic execution, comprising:

upon re-detecting an end of automatic execution, determining whether an input address having undergone a transition matches an address under automatic execution; and if the addresses match, generating a read start trigger signal when the automatic execution function is ended.

A read start trigger signal generating method according to a fourth aspect of the present invention comprises a read start trigger signal generating method for a semiconductor integrated circuit device which has a nonvolatile memory section having an automatic execution function for a data rewrite and a simultaneous execution function for a data read during automatic execution, comprising:

upon re-detecting an end of automatic execution, determining whether an input address having undergone a transition matches an address under automatic execution when a first determination time which contains a response delay time of a polling signal indicating whether the addresses match has elapsed; and if the addresses match, generating a read start trigger signal when a second determination time after the first determination time elapses.

BRIEF DESCRIPTION OF THE SEVERAL VIEWS OF THE DRAWING

FIGS. 7A and 7B are timing charts showing an operation example of the semiconductor integrated circuit device according to the second embodiment of the present invention;

DETAILED DESCRIPTION OF THE INVENTION

Figure 1A:
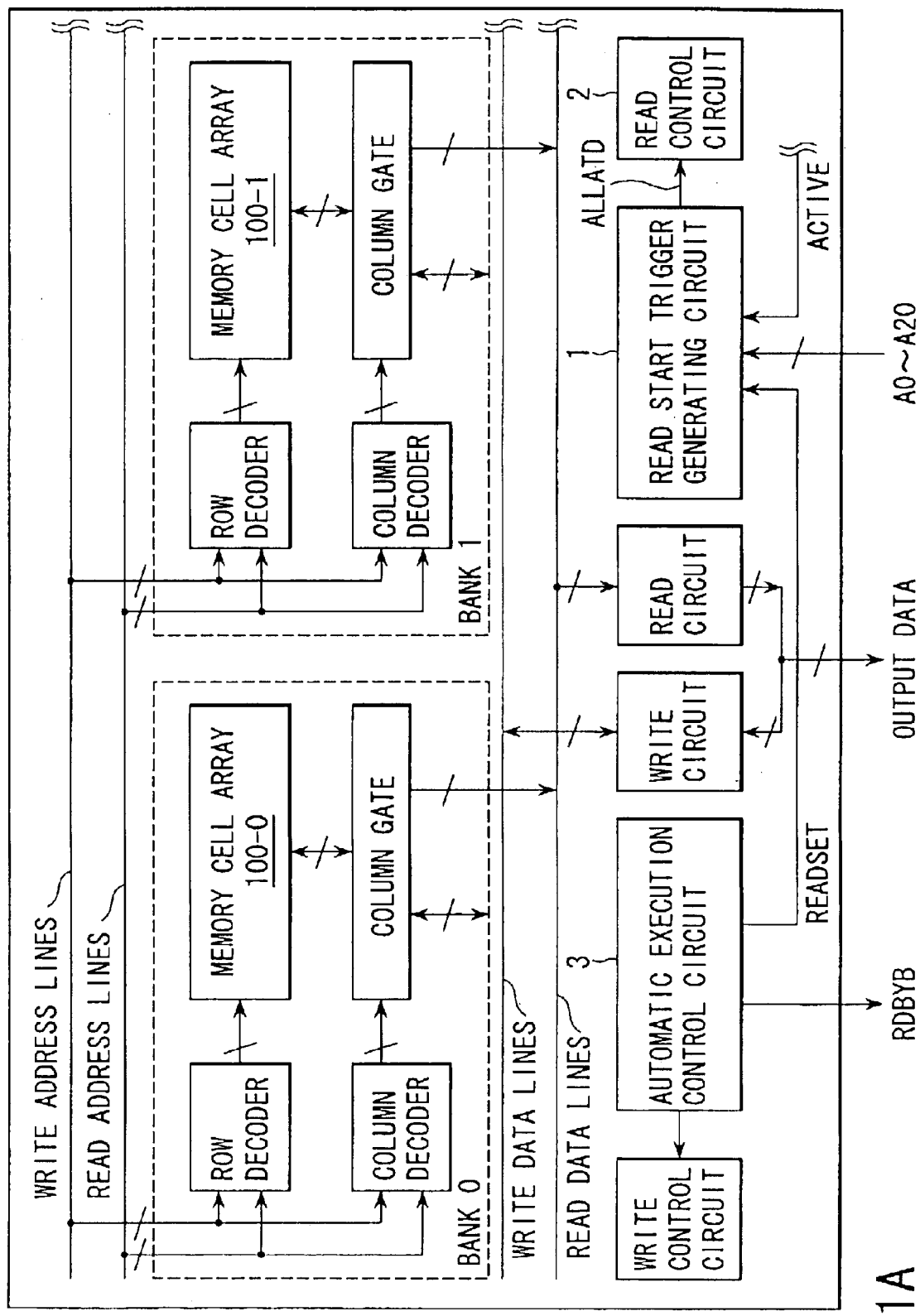
FIG. 1A is a block diagram showing the schematic arrangement of a semiconductor integrated circuit device according to the first embodiment of the present invention.

Some embodiments of the present invention will be described below with reference to the accompanying drawing. In the following description, the same reference numerals denote the same parts throughout the drawing.

(First Embodiment)

FIG. 1A is a block diagram showing the schematic arrangement of a semiconductor integrated circuit device according to the first embodiment of the present invention.

As shown in FIG. 1A, the semiconductor integrated circuit device according to the first embodiment has a nonvolatile memory section. The nonvolatile memory section has an automatic execution function for a data rewrite and a simultaneous execution function for a data read during automatic execution. The simultaneous execution function is also called, e.g., RWW (Read While Write). An EEPROM with RWW is disclosed in, e.g., Jpn. Pat. Appln. KOKAI Publication No. 2001-52495.

The nonvolatile memory section according to the first embodiment includes a first memory cell array 100-0 corresponding to bank 0 and a second memory cell array 100-1 corresponding to bank 1. Peripheral circuits including a row decoder, column decoder, and column gate are independently arranged in each of the memory cell arrays 100-0 and 100-1. The nonvolatile memory section also has write address lines, read address lines, write data lines, and read data lines. In this way, for example, when the peripheral circuits are independently arranged in each of the first and second memory cell arrays 100-0 and 100-1, and the address lines and data lines exclusively used for a read and write are prepared, the nonvolatile memory section can have the automatic execution function for a data rewrite and the simultaneous execution function for a data read during automatic execution.

Figure 1B:
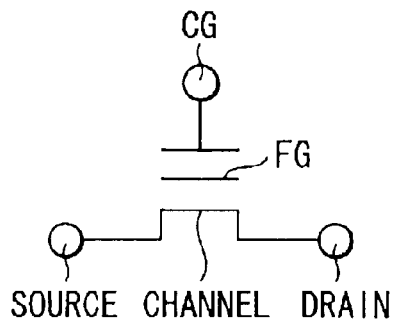
FIG. 1B is a view showing a data-rewritable nonvolatile memory cell.

Nonvolatile memory cells capable of a data rewrite are arranged in the first and second memory cell arrays 100-0 and 100-1. FIG. 1B shows a memory cell. A memory cell MC shown in FIG. 1B is a threshold voltage variable transistor having a floating gate FG between a channel CHANNEL and a control gate CG. The threshold voltage changes depending on the amount of electrons accumulated in the floating gate. The threshold voltage becomes low when electrons are removed from the floating gate and high when electrons are injected into the floating gate. Using this phenomenon, data is rewritten by removing/injecting electrons from/into the floating gate. Data is stored as binary data or multilevel data more than binary data in accordance with the level of the threshold voltage.

The semiconductor integrated circuit device according to the first embodiment has a read start trigger generating circuit 1. The read start trigger generating circuit 1 generates a read start trigger signal ALLATD on the basis of a signal READSET, input addresses A0 to A20, and a signal ACTIVE. The read start trigger signal ALLATD is supplied to, e.g., a read control circuit 2. Upon receiving the read start trigger signal ALLATD, the read control circuit 2 causes the device to execute cell data read operation.

The signal READSET is output from, e.g., an automatic execution control circuit 3. The signal READSET changes from "0" to "1" a predetermined time, e.g., 100 ns before, e.g., the end of automatic operation. The signal READSET is generated using an internal reset signal for the end of automatic operation or an internal clock signal used for the automatic operation. The signal READSET can also be expressed as an advance notice signal which gives an advance notice of the end of automatic execution of bank 0 or bank 1.

As described above, in the first embodiment, the read start trigger signal ALLATD is generated using the signal READSET which changes from "0" to "1" a predetermined time before, e.g., the end of automatic operation. Accordingly, read operation can be started in the nonvolatile memory section before a signal RDBYB changes from "0" to "1". In addition, the read operation can be ended in the nonvolatile memory section before the signal RDBYB changes from "0" to "1". For this reason, switching from the hardware sequence flag to cell data can be executed, e.g., simultaneously when the signal RDBYB changes from "0" to "1".

The arrangement of the read start trigger generating circuit according to the first embodiment will be described next.

Figure 1C:
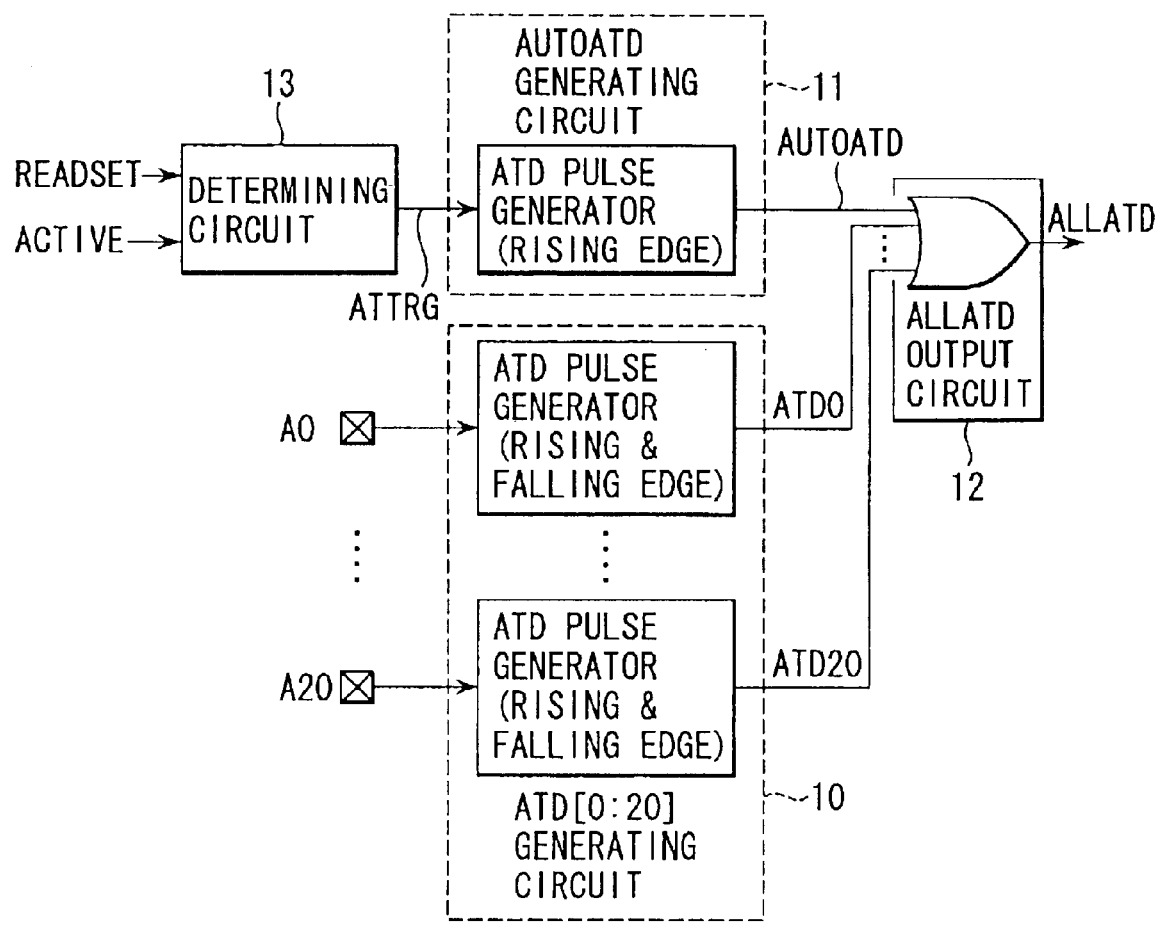
FIG. 1C is a block diagram showing the arrangement of a read start trigger generating circuit in the device.

FIG. 1C is a block diagram showing the arrangement of a read start trigger generating circuit in the device.

As shown in FIG. 1C, the read start trigger generating circuit according to the first embodiment has a first address transition signal generating circuit (to be referred to as an ATD[0:20] generating circuit hereinafter) 10, a second address transition signal generating circuit (to be referred to as an AUTOATD generating circuit hereinafter) 11, a read start trigger output circuit (to be referred to as an ALLATD output circuit hereinafter) 12, and a determining circuit 13.

When transitions of the input addresses A0 to A20 occur, the ATD[0:20] generating circuit 10 detects that the transitions of the input addresses A0 to A20 and generates first address transition signals ATD0 to ATD20.

The AUTOATD generating circuit 11 pre-detects the end of automatic execution of bank 0 or bank 1 and generates a second address transition signal AUTOATD.

The ALLATD output circuit 12 combines the address transition signals ATD0 to ATD20 and AUTOATD and outputs the read start trigger signal ALLATD serving as a trigger for the start of a read. The ALLATD output circuit 12 can be formed from, e.g., a logic gate circuit. The ALLATD output circuit 12 of this example is formed from an OR gate circuit which ORs, e.g., the address transition signals ATD0 to ATD20 and AUTOATD.

When pre-detecting the end of automatic execution, the determining circuit 13 determines whether the nonvolatile memory section is executing read operation based on input address transitions. The determining circuit 13 of this example generates a signal ATTRG on the basis of the signal READSET and signal ACTIVE. The signal ACTIVE indicates whether the nonvolatile memory section is executing read operation based on input address transitions. For example, while the signal ACTIVE is "1", the read operation based on input address transitions is being executed. When the signal ACTIVE is "0", the read operation is not executed. The signal ATTRG is a trigger signal serving as a trigger for generating the address transition signal AUTOATD. The signal ATTRG is supplied to the AUTOATD generating circuit 11.

When the read operation is not being executed, the determining circuit 13 of this example supplies the signal ATTRG to the AUTOATD generating circuit 11 on the basis of the signal READSET. When the read operation is being executed, the determining circuit 13 waits for the end of the read operation. When the read operation is ended, the determining circuit 13 supplies the signal ATTRG to the AUTOATD generating circuit 11.

An example of the read start trigger generating circuit according to the first embodiment will be described next.

Figure 2A:
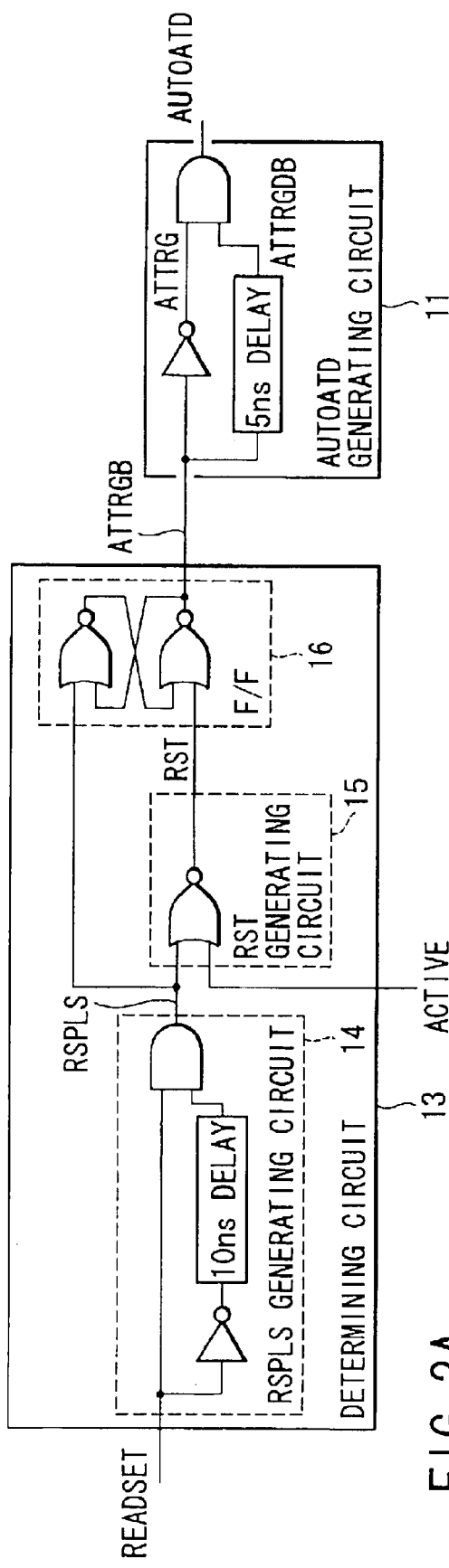
FIG. 2A is a circuit diagram showing examples of a determining circuit and AUTOATD generating circuit shown in FIG. 1C.
Figure 2B:
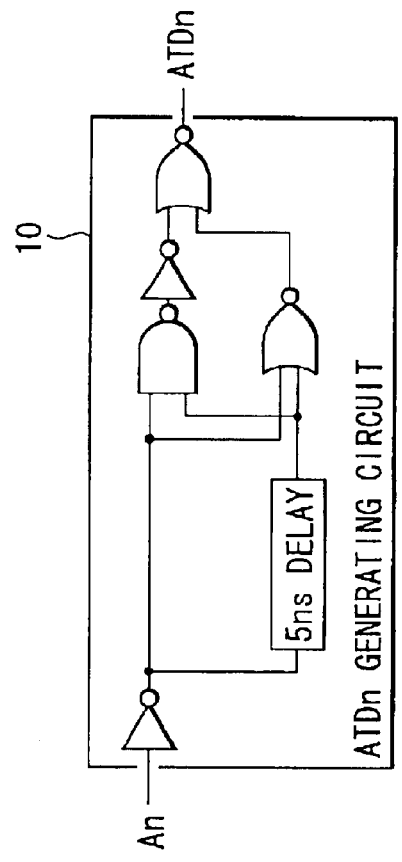
FIG. 2B is a circuit diagram showing an example of an ATD[0:20] generating circuit shown in FIG. 1C.

FIG. 2A is a circuit diagram showing examples of the determining circuit 13 and AUTOATD generating circuit 11 shown in FIG. 1C. FIG. 2B is a circuit diagram showing an example of the ATD[0:20] generating circuit 10 shown in FIG. 1C.

As shown in FIG. 2A, the AUTOATD generating circuit 11 of this example detects the rising edge of the signal ATTRG and generates a pulse signal which is set at "1" level for a predetermined time from the rising edge. In this example, the AUTOATD generating circuit 11 generates the address transition signal AUTOATD which is set at "1" level for, e.g., 5 ns from the rising edge of the signal ATTRG.

The determining circuit 13 of this example includes an RSPLS generating circuit 14 which generates a set pulse RSPLS on the basis of the signal READSET, an RST generating circuit 15 which generates an signal RST on the basis of the set pulse RSPLS and signal ACTIVE, and a flip-flop circuit (to be referred to as an F/F circuit hereinafter) 16 which is reset by the signal RST.

The RSPLS generating circuit 14 of this example detects the rising edge of the signal READSET and generates a pulse signal which is set at "1" level for a predetermined time from the rising edge. In this example, the RSPLS generating circuit 14 generates the set pulse RSPLS which is set at "1" level for, e.g., 10 ns from the rising edge of the signal READSET.

The RST generating circuit 15 of this example is formed from a logic gate circuit. In this example, the RST generating circuit 15 is a NOR gate circuit which NORs the set pulse RSPLS and signal ACTIVE. While the signal ACTIVE is at "1", i.e., while read operation based on input address transitions is being executed, the RST generating circuit 15 sets the signal RST at "0" independently of the set pulse RSPLS.

The F/F circuit 16 of this example is set by the set pulse RSPLS and reset by the signal RST. When the F/F circuit 16 is set, it indicates that the end of automatic operation is pre-detected. When the F/F circuit 16 is reset, it indicates that the read operation based on input address transitions is ended or the read operation is not being executed.

As shown in FIG. 2B, the ATD[0:20] generating circuit 10 of this example detects the rising edge and falling edge of an input address An (n is an integer; n =0 to 20 in this example) and generate a pulse signal which is set at "1" level for a predetermined time from the rising edge or falling edge. In this example, the ATD[0:20] generating circuit 10 generates an address transition signal ATDn which is set at "1" level for, e.g., 5 ns from the rising edge or falling edge of the input address An.

An operation example of the read start trigger generating circuit will be described next.

Figure 3A:
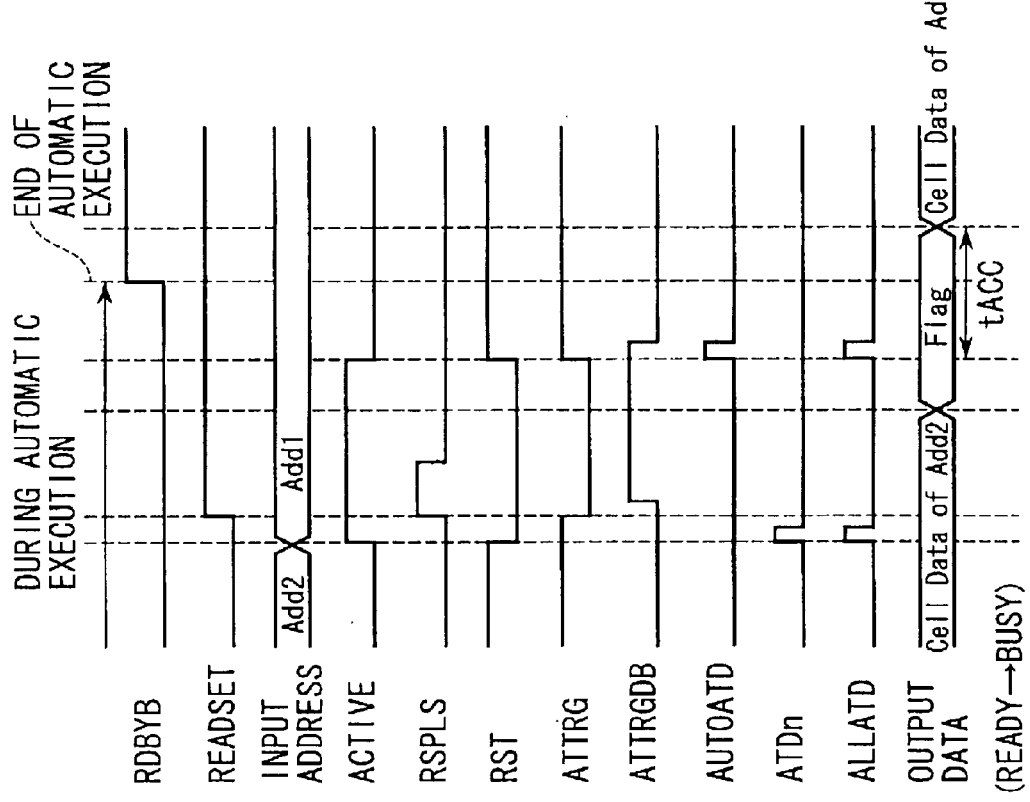
FIGS. 3A and 3B are timing charts showing an operation example of the semiconductor integrated circuit device according to the first embodiment of the present invention.
Figure 3B:
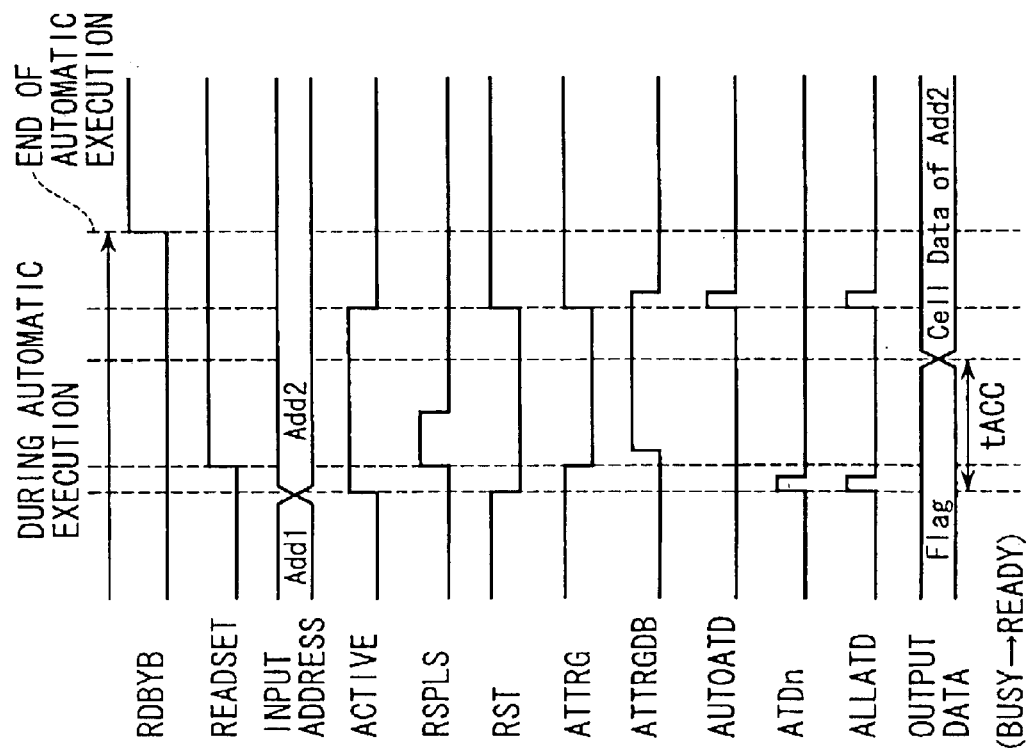
Figure 4:
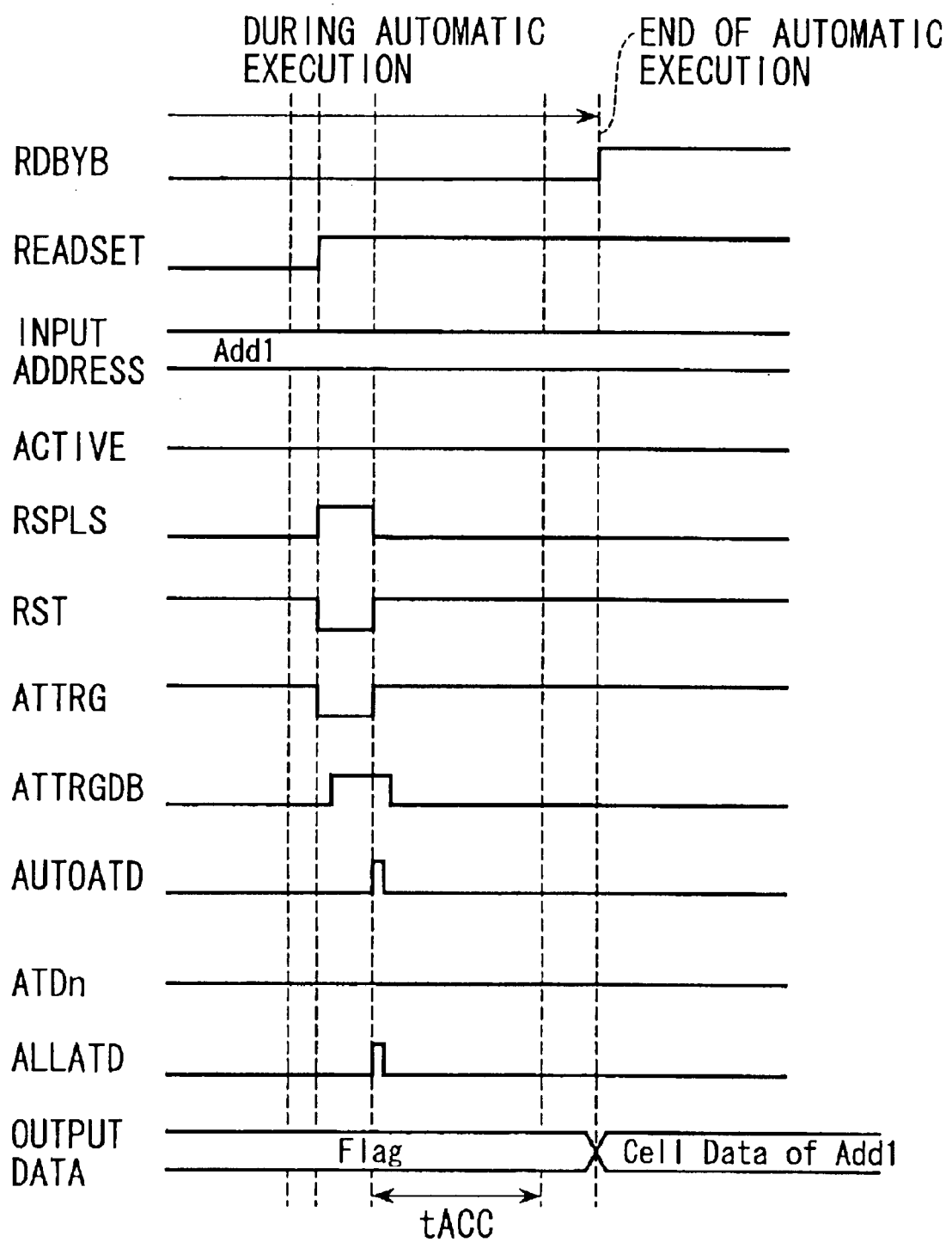
FIG. 4 is a timing chart showing another operation example of the semiconductor integrated circuit device according to the first embodiment the present invention.

FIGS. 3A, 3B, and 4 are timing charts showing operation examples of the read start trigger generating circuit. FIG. 3A shows operation performed when an input address transition occurs from "busy" to "ready". FIG. 3B shows operation performed when an input address transition occurs from "ready" to "busy". FIG. 4 shows operation performed when the signal ACTIVE is kept at "0".

[Busy→Ready]

As shown in FIG. 3A, when the input address changes from Add1 to Add2, the address transition signal ATDn is generated. When the address transition signal ATDn is generated, the read start trigger signal ALLATD is output.

Since the bank corresponding to the input address Add2 is "ready", i.e., no automatic execution is progressing in the bank, cell data can be read out. Hence, after the read start trigger signal ALLATD is output, and then, a predetermined time tACC required for a cell data read has elapsed, data is read out from the bank corresponding to the input address Add2 to the outside of the semiconductor integrated circuit device.

[Ready→Busy]

As shown in FIG. 3B, when the input address changes from Add2 to Add1, the address transition signal ATDn is generated. Accordingly, the read start trigger signal ALLATD is output.

Since the bank corresponding to the input address Add1 is "busy", i.e., automatic execution is progressing in the bank, the device waits for the end of automatic execution. When the signal READSET changes to "1", and the end of automatic operation is pre-detected, the set pulse RSPLS is set at "1" for, e.g., 10 ns. With the set pulse RSPLS, the F/F circuit 16 indicating that the end of automatic operation is pre-detected is set.

While the signal ACTIVE is at "1", the F/F circuit 16 is not reset because the read operation based on the input address transition is being executed.

When the signal ACTIVE has changed from "1" to "0", the F/F circuit 16 is reset because the read operation is ended. When the F/F circuit 16 is reset, the signal ATTRG rises, and the address transition signal AUTOATD is generated for, e.g., 5 ns. When the address transition signal AUTOATD is generated, the read start trigger signal ALLATD is output. When the time tACC has elapsed after output of the read start trigger signal ALLATD, data is read out from the bank corresponding to the input address Add1 to the outside of the semiconductor integrated circuit device.

[No Change in ACTIVE]

As shown in FIG. 4, when the signal ACTIVE is kept unchanged at "0" from the beginning, the set pulse RSPLS falls. Then, the signal RST immediately rises, and the signal ATTRG also rises. At this timing, the address transition signal AUTOATD is generated. The signal READSET is at "1", and automatic execution is internally ended. For this reason, when the read start trigger signal ALLATD is output, and the time tACC has elapsed, data can be read out from the bank corresponding to the input address Add1. After that, when the signal RDBYB changes from "0" to "1", data is read out from the bank corresponding to the input address Add1 to the outside of the semiconductor integrated circuit device.

As described above, according to the semiconductor integrated circuit device of the first embodiment, the read start trigger signal ALLATD is generated using the signal READSET which changes from "0" to "1" a predetermined time before, e.g., the end of automatic operation. Accordingly, read operation can be started in the nonvolatile memory section before, e.g., the signal RDBYB changes from "0" to "1". In addition, the read operation can be ended in the nonvolatile memory section before, e.g., the signal RDBYB changes from "0" to "1". For this reason, switching from the hardware sequence flag to cell data can be executed, e.g., simultaneously when the signal RDBYB changes from "0" to "1". Hence, the simultaneous execution operation can be performed at a high speed.

In the first embodiment, in pre-detecting the end of automatic execution, it is also determined whether the nonvolatile memory section is executing the read operation based on input address transitions. If the read operation is being executed, the read start trigger signal ALLATD is generated after the end of read operation. With such determination, data conflict in, e.g., the read circuit can be suppressed.

(Second Embodiment)

Figure 5A:
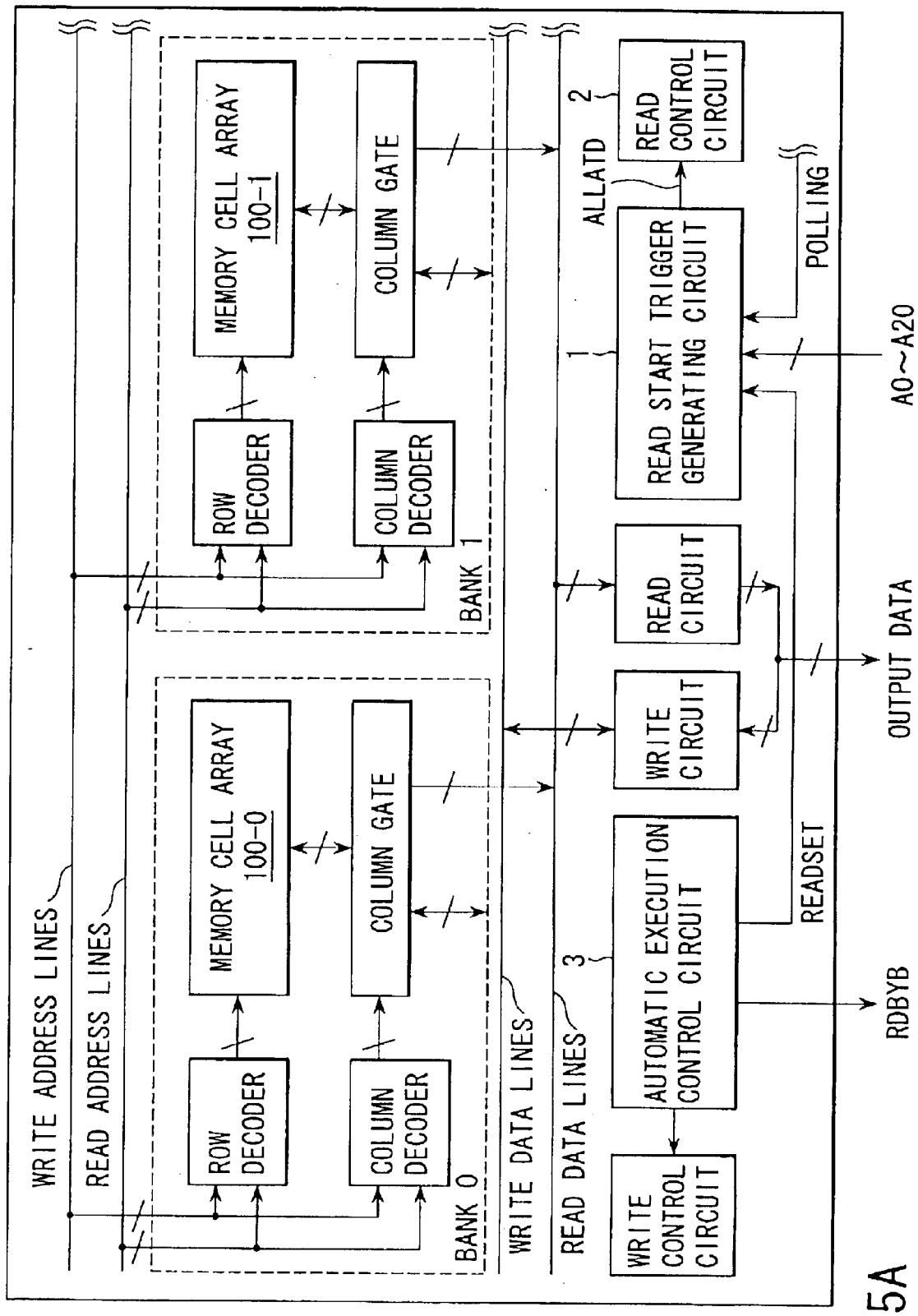
FIG. 5A is a block diagram showing the schematic arrangement of a semiconductor integrated circuit device according to the second embodiment of the present invention.
Figure 5B:
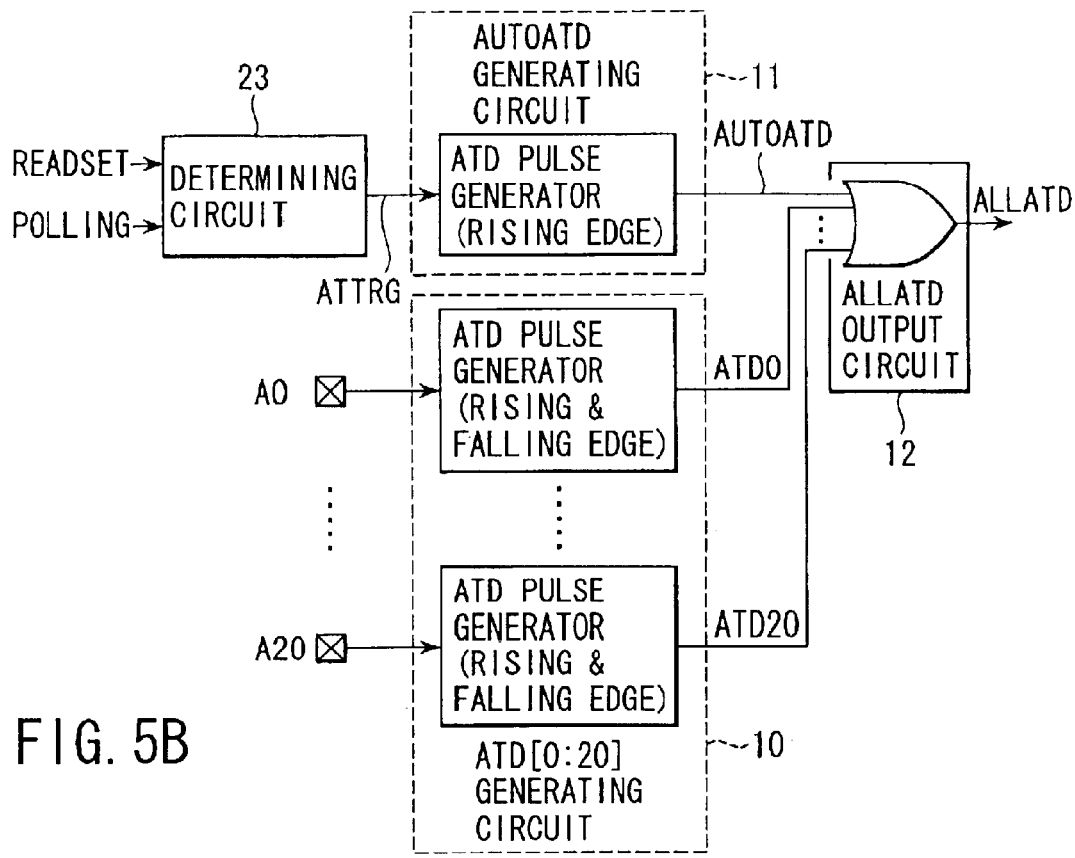
FIG. 5B is a block diagram showing the arrangement of a read start trigger generating circuit in the device.

FIG. 5A is a block diagram showing the schematic arrangement of a semiconductor integrated circuit device according to the second embodiment of the present invention. FIG. 5B is a block diagram showing the arrangement of a read start trigger generating circuit in the device.

As shown in FIGS. 5A and 5B, the semiconductor integrated circuit device according to the second embodiment is particularly different from that of the first embodiment in that a determining circuit 23 determines in pre-detecting the end of automatic execution whether an input address having undergone a transition matches an address under automatic execution. The remaining components are almost the same as in the first embodiment.

When the input address having undergone the transition matches the address under automatic execution, the determining circuit 23 supplies a trigger signal ATTRG to an AUTOATD generating circuit 11 on the basis of a signal READSET. Whether the input address having undergone the transition matches the address under automatic execution is detected by a polling signal POLLING. The polling signal POLLING changes to "1", for example, when the input address An having undergone the transition matches the address under automatic execution and "0" when the addresses do not match.

An example of the read start trigger generating circuit according to the second embodiment will be described next.

Figure 6A:
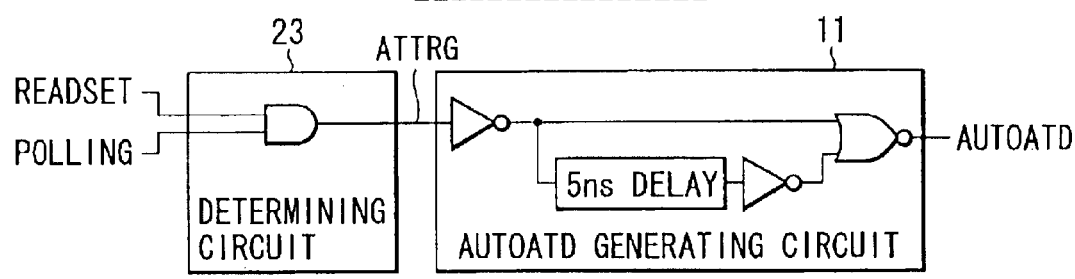
FIG. 6A is a circuit diagram showing examples of a determining circuit and AUTOATD generating circuit shown in FIG. 5B.
Figure 6B:
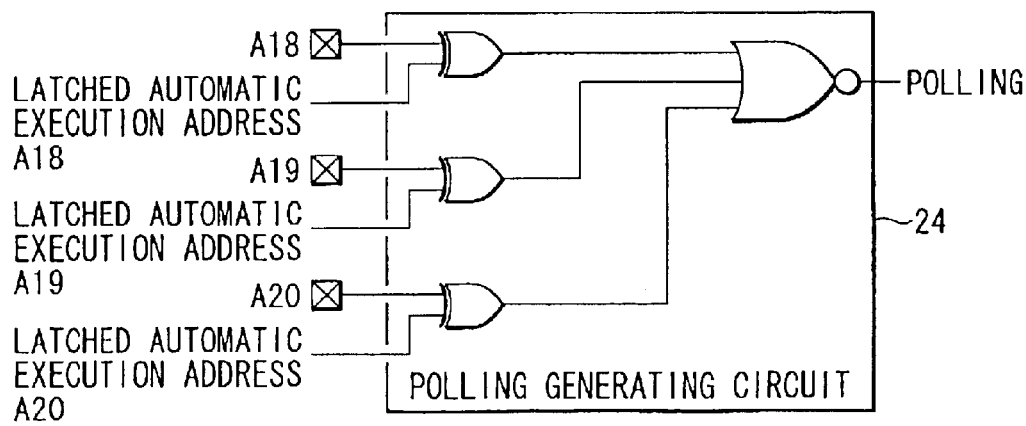
FIG. 6B is a circuit diagram showing an example of a POLLING generating circuit.

FIG. 6A is a circuit diagram showing examples of the determining circuit and AUTOATD generating circuit shown in FIG. 5B. FIG. 6B is a circuit diagram showing an example of the polling generating circuit.

As shown in FIG. 6A, the AUTOATD generating circuit 11 of the example detects the rising edge of the signal ATTRG and generates a pulse signal which is set at "1" level for a predetermined time from the rising edge. In this example, the AUTOATD generating circuit 11 generates an address transition signal AUTOATD which is set at "1" for, e.g., 5 ns from the rising edge of the signal ATTRG.

The determining circuit 23 of this example is formed from a logic gate circuit. In this example, the determining circuit 23 is an AND gate circuit which ANDs the signal READSET and signal POLLING. When both the signal READSET and the signal POLLING are at "1", the determining circuit 23 changes the signal ATTRG to "1". More specifically, when automatic execution is pre-detected, and the input address having undergone the transition matches the address under automatic execution, the signal ATTRG changes to "1". Accordingly, the address transition signal AUTOATD is generated.

As shown in FIG. 6B, a POLLING generating circuit 24 latches, of automatic execution addresses, an address for designating a bank and compares the latched automatic execution address with the input address. In this example, the POLLING generating circuit 24 latches addresses A18 to A20 of the automatic execution addresses and compares the latched automatic execution addresses A18 to A20 with input addresses A18 to A20, respectively. In this example, a logic gate circuit, e.g., an XOR gate circuit is used as the address comparison circuit. Only when the addresses match, "0" is output. When all comparison results are "0", i.e., all the latched automatic execution addresses A18 to A20 match the input addresses A18 to A20, the polling signal POLLING is set at "1".

An operation example of the read start trigger generating circuit will be described next.

FIGS. 7A and 7B are timing charts showing an operation example of the read start trigger generating circuit. FIG. 7A shows operation performed when the transition of an input address occurs from "busy" to "ready". FIG. 7B shows operation performed when the transition of an input address occurs from "ready" to "busy".

[Busy→Ready]

As shown in FIG. 7A, when the input address changes from Add1 to Add2, an address transition signal ATDn is generated. When the address transition signal ATDn is generated, the read start trigger signal ALLATD is output.

Since the bank corresponding to the input address Add2 is "ready", i.e., no automatic execution is progressing in the bank, the input address Add2 does not match the address of the bank under automatic execution. Hence, the polling signal POLLING is set at "0". For this reason, even when the signal READSET changes to "1", neither the signal ATTRG nor the address transition signal AUTOATD is generated. Hence, after the read start trigger signal ALLATD is output, and then, a predetermined time tACC required for a cell data read has elapsed, data is read out from the bank corresponding to the input address Add2 to the outside of the semiconductor integrated circuit device.

[Ready→Busy]

As shown in FIG. 7B, when the input address changes from Add2 to Add1, the address transition signal ATDn is generated. Accordingly, the read start trigger signal ALLATD is output.

Since the bank corresponding to the input address Add1 is "busy", i.e., automatic execution is progressing in the bank, the input address Add1 matches the address of the bank under automatic execution. Hence, the polling signal POLLING is set at "1". When the signal READSET changes to "1", the signal ATTRG is generated. Accordingly, the address transition signal AUTOATD is generated. The read start trigger signal ALLATD is output again. At this time, the signal READSET is at "1", and automatic execution is internally ended. For this reason, when the read start trigger signal ALLATD is output, and the time tACC has elapsed, data is read out from the bank corresponding to the input address Add1. After that, when a signal RDBYB changes from "0" to "1", data is read out from the bank corresponding to the input address Add1 to the outside of the semiconductor integrated circuit device.

As described above, in the semiconductor integrated circuit device according to the second embodiment as well, the read start trigger signal ALLATD is generated using the signal READSET which changes from "0" to "1" a predetermined time before, e.g., the end of automatic operation. Accordingly, switching from the hardware sequence flag to cell data can be executed, e.g., simultaneously when the signal RDBYB changes from "0" to "1", as in the first embodiment. Hence, the simultaneous execution operation can be performed at a high speed.

In the second embodiment, in pre-detecting the end of automatic execution, it is also determined whether the input address having undergone the transition matches the address under automatic execution. Only when the addresses match, the address transition signal AUTOATD is generated. That is, the address transition signal AUTOATD can be generated only when it is necessary. For this reason, unwanted generation of the read start trigger signal ALLATD can be suppressed, and the operation of the read start trigger generating circuit 1 can be stabilized, as compared to the first embodiment in which, e.g., the read start trigger signal ALLATD is generated even when it is unnecessary.

Hence, in the second embodiment, since the operation of the read start trigger generating circuit 1 is stable, the automatic execution operation can be performed at a higher speed.

(Third Embodiment)

In the second embodiment, for example, the polling signal POLLING is generated using the logic gate circuit which compares the latched automatic execution addresses A18 to A20 with the input addresses A18 to A20. Since the addresses are compared using the logic gate circuit, transitions of the input addresses A18 to A20 may be delayed.

Figure 8:
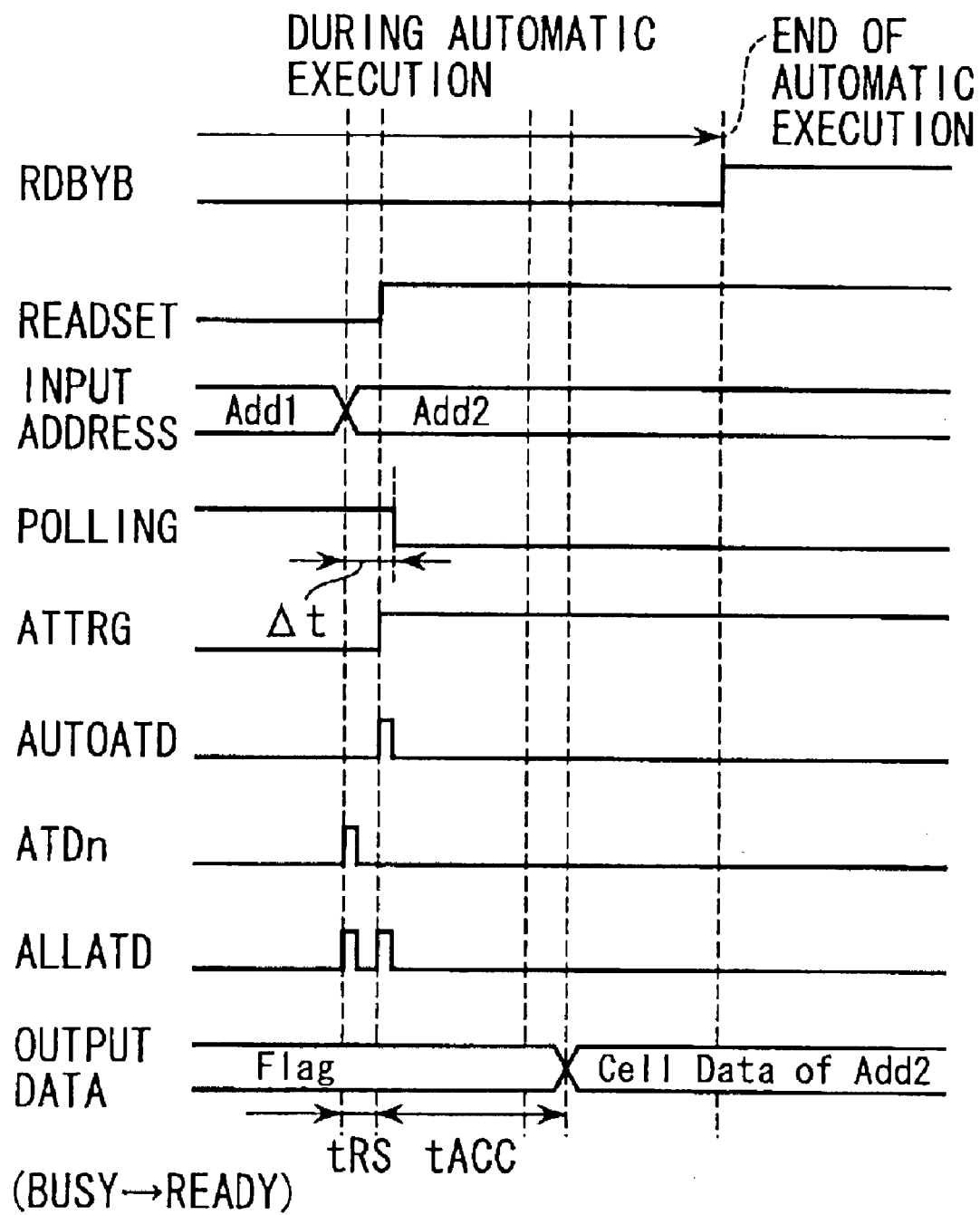
FIG. 8 is a timing chart showing another operation example of the semiconductor integrated circuit device according to the second embodiment of the present invention.

When the delay becomes large due to some reason, an operation waveform as shown in FIG. 8 may be generated.

As shown in FIG. 8, assume that after the polling signal POLLING delays from an input address transition by Δt, and the signal READSET has changed from "0" to "1", the polling signal POLLING changes from "1" to "0". In this case, both the signal READSET and the signal POLLING are set at "1" during a certain period. For this reason, the signal ATTRG changes to "1". Then, the signal AUTOATD is generated, and the read start trigger signal ALLATD is output. The read operation is started from the signal AUTOATD generated again. Hence, the timing of the read start is delayed by time tRS from an input address transition to pre-detection of the end of automatic operation.

In the third embodiment, even when generation of a polling signal POLLING is delayed, the read can be started at the same timing as in normal operation.

Figure 9:
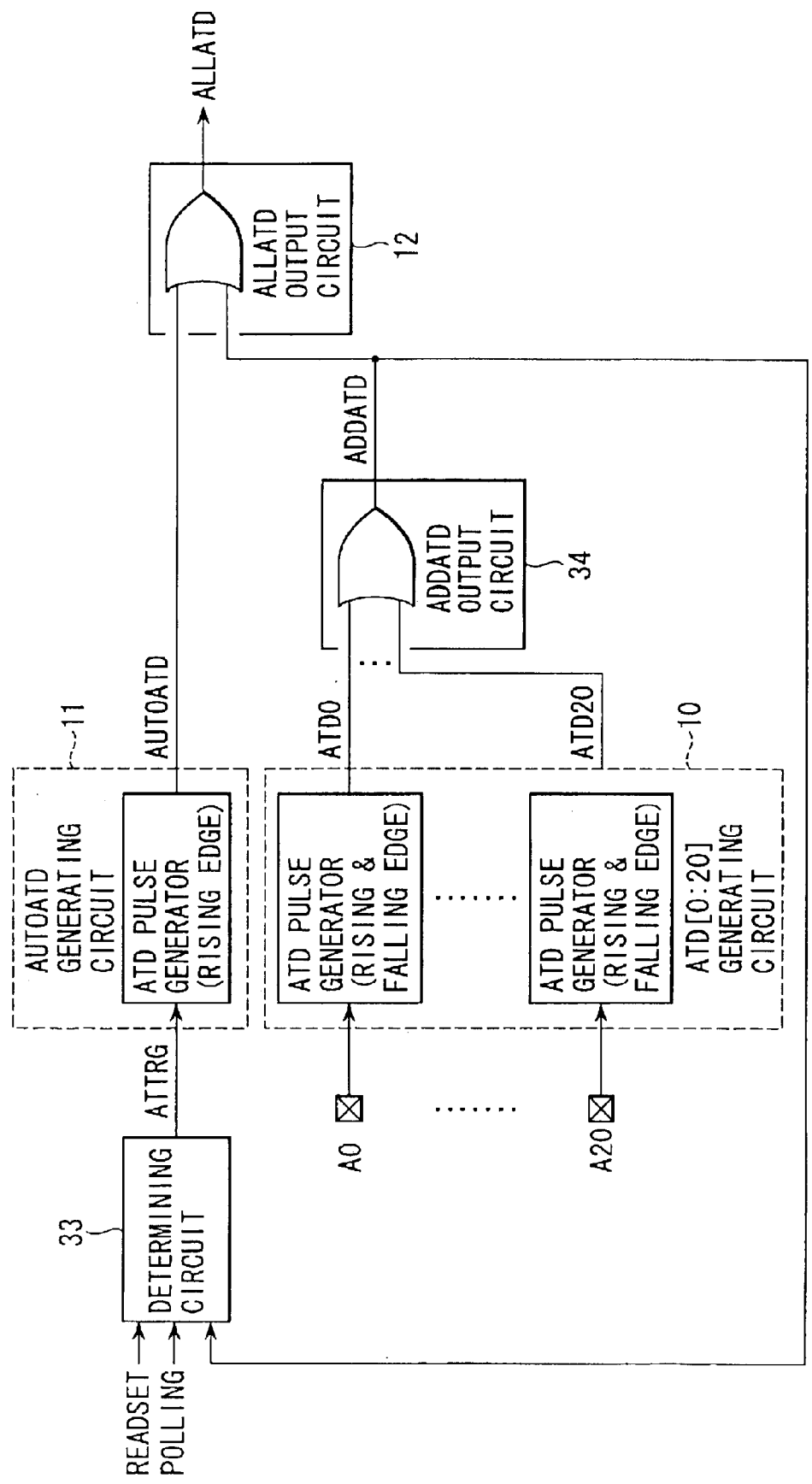
FIG. 9 is a block diagram showing the arrangement of a read start trigger generating circuit prepared in a semiconductor integrated circuit device according to the third embodiment of the present invention.

FIG. 9 is a block diagram showing the arrangement of a read start trigger generating circuit prepared in a semiconductor integrated circuit device according to the third embodiment of the present invention.

As shown in FIG. 9, the semiconductor integrated circuit device according to the third embodiment is particularly different from that of the second embodiment in that in pre-detecting the end of automatic execution, a determining circuit 33 receives a signal ADDATD that indicates whether an input address transition has occurred. The signal ADDATD changes to "1" when the transition of even one of address transition signals ATD0 to ATD20 has occurred. The signal ADDATD is output from an ADDATD output circuit 34. The ADDATD output circuit 34 can be formed from a logic gate circuit for receiving, e.g., the address transition signals ATD0 to ATD20. In this example, the ADDATD output circuit 34 is formed from an OR gate circuit which ORs, e.g., the address transition signals ATD0 to ATD20.

An example of the determining circuit 33 will be described next.

Figure 10:
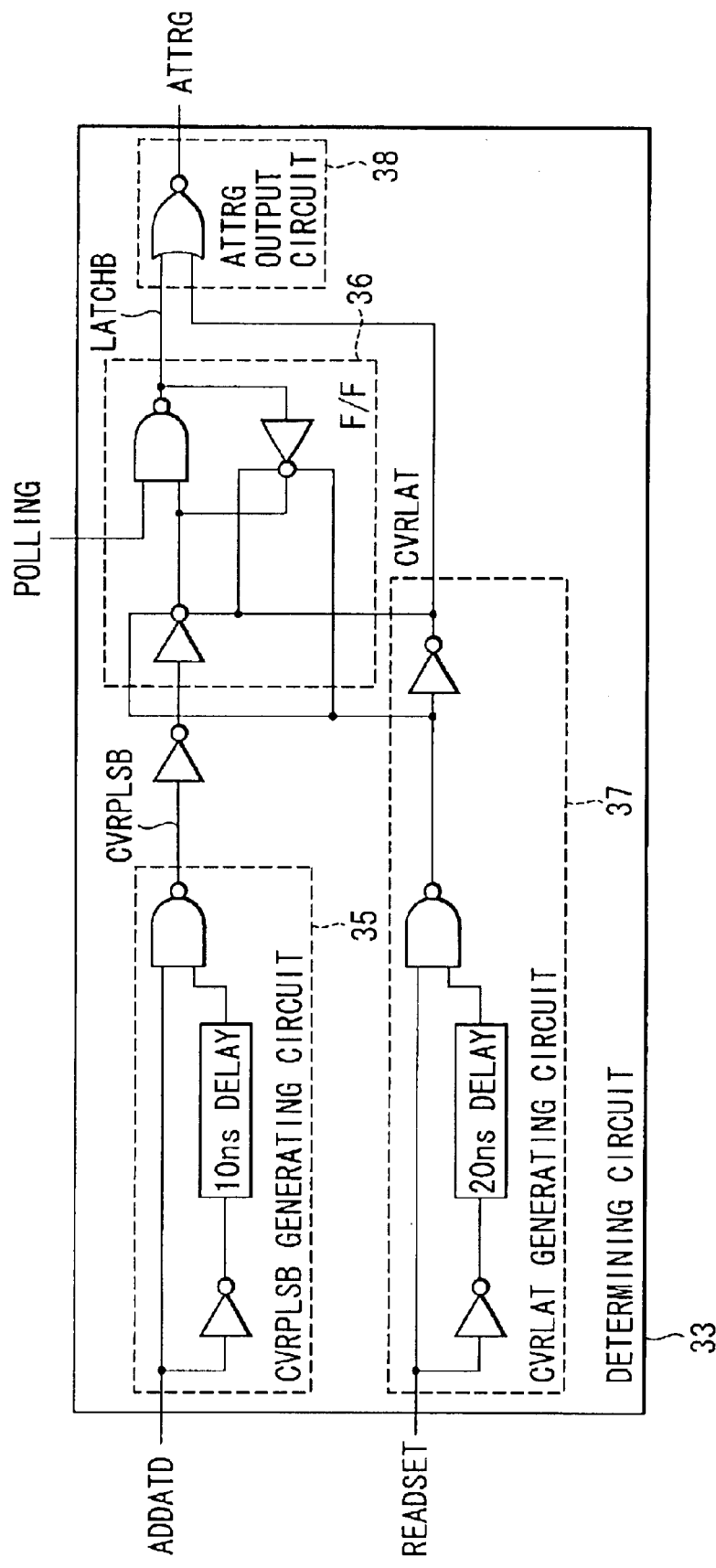
FIG. 10. is a circuit diagram showing an example of a determining circuit shown in FIG. 9.

FIG. 10 is a circuit diagram showing an example of the determining circuit 33 shown in FIG. 9.

As shown in FIG. 10, the determining circuit 33 of this example has a CVRPLSB generating circuit 35, an F/F circuit 36, a CVRLAT generating circuit 37, and an ATTRG output circuit 38.

The CVRPLSB generating circuit 35 of this example detects the rising edge of the signal ADDATD and generates a pulse signal which is set at "0" for a predetermined time from the rising edge. In this example, the CVRPLSB generating circuit 35 generates a signal CVRPLSB which is set at "1" for, e.g., 10 ns from the rising edge of the signal ADDATD. The CVRPLSB generating circuit 35 is a first determination time setting circuit which sets the first determination time. The first determination time means a time during which it is determined whether the polling signal POLLING indicates matching or mismatching. In this example, for example, when the signal CVRPLSB has changed from "0" to "1", e.g., a time of 10 ns has elapsed, it is determined whether the polling signal POLLING indicates matching or mismatching. During the first determination time, even when the polling signal POLLING is in a state indicating matching, it is regarded that a bank other than the bank under automatic execution is read-accessed.

The first determination time contains the response delay time of the polling signal POLLING. For this reason, even when the response of the polling signal POLLING delays, the response delay is permitted because whether the polling signal POLLING indicates matching or mismatching is determined when first determination time has elapsed.

The F/F circuit 36 of this example is reset by the signal CVRPLSB and set when the polling signal POLLING indicates during the first determination time a state wherein the input address having undergone the transition matches the address under automatic execution.

During the first determination time, the F/F circuit 36 is set by the CVRPLSB generating circuit 35 in a state (reset state) wherein the input address having undergone the transition does not match the address under automatic execution independently of the polling signal POLLING. After the elapse of the first determination time, if the polling signal POLLING is at "1", the F/F circuit 37 is set in a state (set state) wherein the input address having undergone the transition matches the address under automatic execution. If the polling signal POLLING is at "0", the reset state is maintained.

The CVRLAT generating circuit 37 of this example detects the rising edge of the signal READSET and generates a pulse signal which is set at "0" level during a predetermined time from the rising edge. In this example, the CVRLAT generating circuit 37 generates a signal CVR- LAT which is set at "1" for, e.g., 20 ns from the rising edge of the signal READSET. The CVRLAT generating circuit 37 is a second determination time setting circuit which sets the second determination time. The second determination time means a time during which the signal ATTRG is generated. In this example, during the second determination time, the ATTRG output circuit 38 is inactivated. After the elapse of the second determination time, the ATTRG output circuit 38 is activated.

Note that the time (second determination time) during which the signal CVRLAT is set at "1" is longer than the time (first determination time) during which the signal CVRPLSB is set at "0". This is because if the first determination time is ended during the second determination time, the signal AUTOATD may not be generated.

When the ATTRG output circuit 38 is inactive, it sets the signal ATTRG to "0" independently of an output signal LATCHB from the F/F circuit 36. When the ATTRG output circuit 38 is active, it sets the signal ATTRG to "0" or "1" in accordance with the output signal LATCHB from the F/F circuit 36.

An operation example of the read start trigger generating circuit will be described next.

Figure 11A:
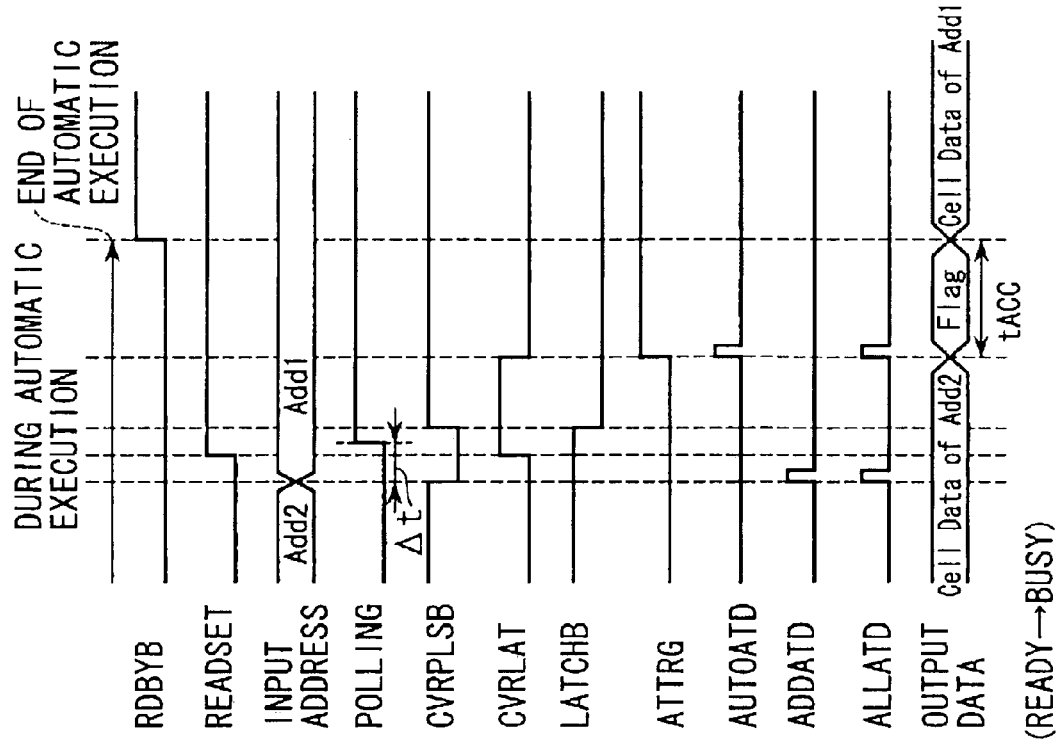
FIGS. 11A and 11B are timing charts showing an operation example of the semiconductor integrated circuit device according to the third embodiment of the present invention.
Figure 11B:
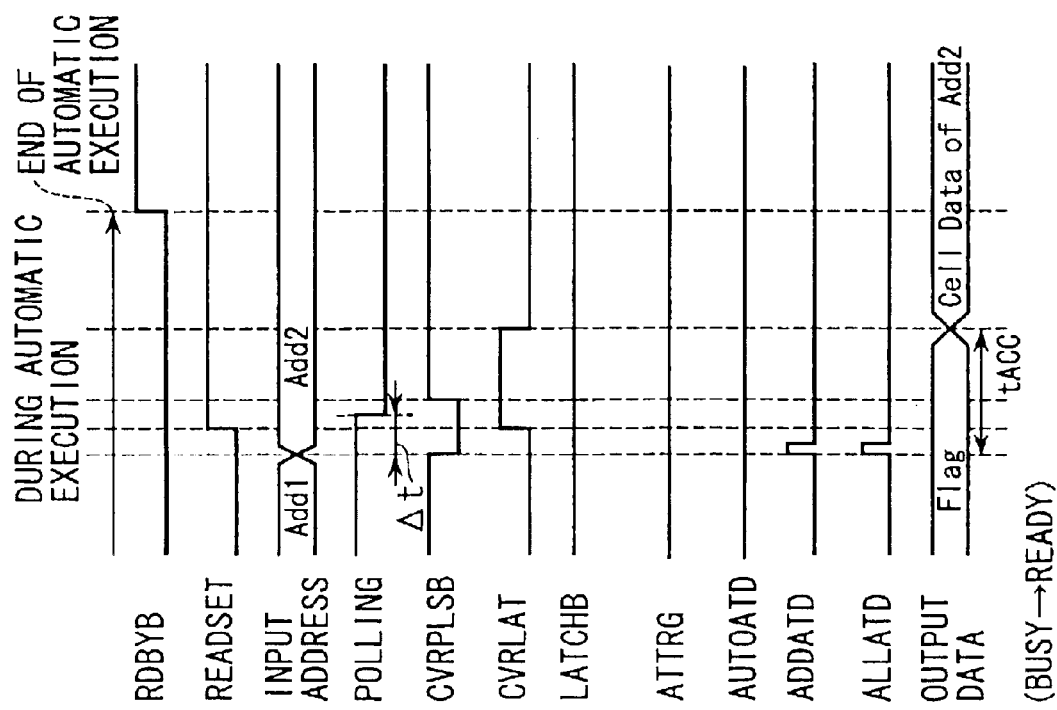

FIGS. 11A and 11B are timing charts showing an operation example of the read start trigger generating circuit. FIG. 11A shows a case wherein the transition of an input address occurs from "busy" to "ready". FIG. 11B shows a case wherein the transition of an input address occurs from "ready" to "busy".

[Busy→Ready]

As shown in FIG. 11A, when the input address changes from Add1 to Add2, the address transition signal ADDATD is generated. When the address transition signal ADDATD is generated, the read start trigger signal ALLATD is output.

In addition, when the transition signal ADDATD is generated, the signal CVRPLSB changes to "0" to reset the F/F circuit 36. When the F/F circuit 36 is in the reset state, the signal LATCHB is at "1".

Next, when the signal READSET changes to "1", the signal CVRLAT changes to "1".

Since the bank corresponding to the input address Add2 is "ready", i.e., no automatic execution is progressing in the bank, the input address Add2 does not match the address of the bank under automatic execution. Hence, the polling signal POLLING is set at "0".

When the signal CVRPLSB has changed from "0" to "1", i.e., the first determination time has elapsed, the polling signal is at "0". For this reason, the F/F circuit 36 is not set but maintains the reset state.

Even when the polling signal POLLING changes to "0" after the signal READSET has changed to "1" due to a delay, no signal ATTRG is generated.

When the signal CVRLAT has changed from "1" to "0", i.e., the second determination time has elapsed, the signal LATCHB is at "1". Since the signal ATTRG is kept at "0", no read start trigger signal ALLATD is generated.

Hence, after the read start trigger signal ALLATD is output, and then, the predetermined time tACC required for a cell data read has elapsed, data is read out from the bank corresponding to the input address Add2 to the outside of the semiconductor integrated circuit device.

[Ready→Busy]

As shown in FIG. 11B, when the input address changes from Add2 to Add1, the address transition signal ATDn is generated. Accordingly, the read start trigger signal ALLATD is output.

In addition, when the transition signal ADDATD is generated, the signal CVRPLSB changes to "0" to reset the F/F circuit 36. When the F/F circuit 36 is in the reset state, the signal LATCHB is at "1".

Next, when the signal READSET changes to "1", the signal CVRLAT changes to "1".

Since the bank corresponding to the input address Add1 is "busy", i.e., automatic execution is progressing in the bank, the input address Add1 matches the address of the bank under automatic execution. Hence, the polling signal POLLING is set at "1".

When the signal CVRPLSB has changed from "0" to "1", i.e., the first determination time has elapsed, the polling signal is at "1". For this reason, the F/F circuit 36 is set. When the F/F circuit 36 is in the set state, the signal LATCHB is at "0".

When the signal CVRLAT has changed from "1" to "0", i.e., the second determination time has elapsed, the signal LATCHB is at "0". Hence, the signal ATTRG changes to "1". Accordingly, the read start trigger signal ALLATD is output again. The signal READSET is at "1", and automatic execution is internally ended. For this reason, after the read start trigger signal ALLATD is output again, and the time tACC has elapsed, data is read out from the bank corresponding to the input address Add1. After that, when the signal RDBYB changes from "0" to "1", data is read out from the bank corresponding to the input address Add1 to the outside of the semiconductor integrated circuit device.

In the third embodiment, the timing of generation of the address transition signal AUTOATD is delayed from the rising edge of the signal READSET by a time corresponding to the pulse width of the signal CVRLAT. However, it poses no problem because the read operation only needs to be ended until the timing when the signal RDBYB changes to "1", i.e., the automatic operation is completely ended.

As described above, in the semiconductor integrated circuit device according to the third embodiment as well, the read start trigger signal ALLATD is generated using the signal READSET which changes from "0" to "1" a predetermined time before, e.g., the end of automatic operation. Hence, switching from the hardware sequence flag to cell data can be executed, e.g., simultaneously when the signal RDBYB changes from "0" to "1", as in the first embodiment. For this reason, the simultaneous execution operation can be performed at a high speed.

In the third embodiment, the same advantage as in the second embodiment can be obtained. In addition, even when generation of the polling signal POLLING is delayed, the read can be started at the same timing as in normal operation.

Hence, in the third embodiment, the automatic execution operation can be performed at a higher speed that in the second embodiment.

The present invention has been described above on the basis of the first to third embodiments. However, the present invention is not limited to these embodiments, and various changes and modifications can be made within the spirit and scope of the invention.

For example, two bands are set in the above embodiments, though the number of banks may be set to two or more.

As the nonvolatile memory cell MC capable of a data rewrite, a threshold voltage variable transistor has been exemplified. However, the nonvolatile memory cell is not limited to the threshold voltage variable transistor as long as it can rewrite data.

Each of the above embodiments can be independently practiced. However, they may be appropriately combined.

The embodiments incorporate inventions of various stages, and inventions of various stages can be extracted by appropriately combining a plurality of constituent elements disclosed in the embodiments.

The above embodiments have been described on the basis of examples in which the present invention is applied to a nonvolatile semiconductor memory device. The present invention also incorporates a semiconductor integrated circuit device such as a processor or system LSI incorporating the above-described nonvolatile semiconductor memory device.

As has been described above, according to the above embodiments, a semiconductor integrated circuit device which has a nonvolatile memory section having an automatic execution function for a data rewrite and a simultaneous execution function for a data read during automatic execution and, more particularly, a semiconductor integrated circuit device capable of performing high-speed automatic execution operation and a read start trigger signal generating method for the device can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device which has a nonvolatile memory section having an automatic execution function for a data rewrite and a simultaneous execution function for a data read during automatic execution, comprising:

a first memory cell array which has nonvolatile memory cells arrayed and corresponds to one bank;

a second memory cell array which has nonvolatile memory cells arrayed and corresponds to the other bank different from said one bank;

a plurality of first address transition signal generating circuits which detect transitions of input addresses when the transitions of the input addresses have occurred and generate a plurality of first address transition signals;

a second address transition signal generating circuit which pre-detects an end of automatic execution of said one bank and generates a second address transition signal; and a read start trigger output circuit which outputs a read start trigger signal serving as a trigger for a start of a read on the basis of the first address transition signals and the second address transition signal.

2. The device according to claim 1, further comprising:

a determining circuit which, in pre-detecting the end of automatic execution, determines whether the nonvolatile memory section is executing read operation based on an input address transition, when the read operation is not being executed, the determining circuit supplying a trigger signal serving as a trigger for the second address transition signal to the second address transition signal generating circuit on the basis of an advance notice signal which gives an advance notice of the end of automatic execution of said one bank, and when the read operation is being executed, the determining circuit waiting for an end of read operation and then supplying the trigger signal to the second address transition signal generating circuit when the read operation is ended.

3. The device according to claim 2, wherein the determining circuit includes a flip-flop circuit which is set in pre-detecting the end of automatic execution and reset when the read operation is ended.

4. The device according to claim 1, further comprising:

a determining circuit which, in pre-detecting the end of automatic execution, determines whether an input address having undergone a transition matches an address under automatic execution, when the input address having undergone the transition matches the address under automatic execution, the determining circuit supplying a trigger signal serving as a trigger for the second address transition signal to the second address transition signal generating circuit on the basis of an advance notice signal which gives an advance notice of the end of automatic execution of said one bank.

5. The device according to claim 4, wherein the determining circuit includes a logic circuit which outputs the trigger signal on the basis of the advance notice signal and a polling signal that indicates whether the input address having undergone the transition matches the address under automatic execution.

6. The device according to claim 5, wherein the determining circuit includes a first determination time setting circuit which sets a first determination time during which it is determined whether the input address having undergone the transition matches the address under automatic execution.

7. The device according to claim 6, wherein the first determination time setting circuit sets the first determination time on the basis of an address transition signal indicating the transition of the input address.

8. The device according to claim 7, wherein the first determination time contains a response delay time of the polling signal.

9. The device according to claim 6, wherein during the first determination time, the first determination time setting circuit sets a state wherein the input address having undergone the transition does not match the address under automatic execution independently of the polling signal, and when the first determination time has elapsed, the first determination time setting circuit sets a state wherein it can be determined whether the input address having undergone the transition matches the address under automatic execution in accordance with the polling signal.

10. The device according to claim 9, wherein the determining circuit includes a flip-flop circuit which is reset at the time of the input address transition and set during the first determination time when the polling signal indicates a state wherein the input address having undergone the transition matches the address under automatic execution.

11. The device according to claim 5, wherein the determining circuit includes a second determination time setting circuit which sets a second determination time during which the second address transition signal is generated.

12. The device according to claim 11, wherein the determining circuit sets the second determination time on the basis of the advance notice signal.

13. The device according to claim 12, wherein during the second determination time, the second determination time setting circuit inactivates a logic circuit which outputs the trigger signal, and when the second determination time has elapsed, the second determination time setting circuit activates the logic circuit.

14. A read start trigger signal generating method for a semiconductor integrated circuit device which has a nonvolatile memory section having an automatic execution function for a data rewrite and a simultaneous execution function for a data read during automatic execution, comprising:

upon re-detecting an end of automatic execution, determining whether the nonvolatile memory section is executing read operation based on input address transitions;

generating a read start trigger signal when the read operation is not being executed; and if the read operation is being executed, generating the read start trigger signal when the read operation is ended.

15. A read start trigger signal generating method for a semiconductor integrated circuit device which has a nonvolatile memory section having an automatic execution function for a data rewrite and a simultaneous execution function for a data read during automatic execution, comprising:

upon re-detecting an end of automatic execution, determining whether an input address having undergone a transition matches an address under automatic execution; and if the addresses match, generating a read start trigger signal when the automatic execution function is ended.

16. A read start trigger signal generating method for a semiconductor integrated circuit device which has a nonvolatile memory section having an automatic execution function for a data rewrite and a simultaneous execution function for a data read during automatic execution, comprising:

upon re-detecting an end of automatic execution, determining whether an input address having undergone a transition matches an address under automatic execution when a first determination time which contains a response delay time of a polling signal indicating whether the addresses match has elapsed; and if the addresses match, generating a read start trigger signal when a second determination time after the first determination time elapses.

* * * * *